(12) United States Patent
Yan et al.

(10) Patent No.: US 9,461,145 B2
(45) Date of Patent: Oct. 4, 2016

(54) OPC ENLARGED DUMMY ELECTRODE TO ELIMINATE SKI SLOPE AT ESIGE

(71) Applicant: GLOBALFOUNDRIES Inc., Grand Cayman (KY)

(72) Inventors: Ran Yan, Dresden (DE); Jan Hoentschel, Dresden (DE); Martin Gerhardt, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 51 days.

(21) Appl. No.: 14/503,810

(22) Filed: Oct. 1, 2014

(65) Prior Publication Data

US 2016/0099336 A1    Apr. 7, 2016

(51) Int. Cl.
| | |
|---|---|
| H01L 21/3213 | (2006.01) |
| G03F 1/36 | (2012.01) |
| H01L 29/66 | (2006.01) |
| H01L 21/762 | (2006.01) |
| H01L 29/165 | (2006.01) |
| H01L 29/08 | (2006.01) |
| H01L 21/02 | (2006.01) |
| H01L 29/06 | (2006.01) |
| H01L 29/78 | (2006.01) |
| H01L 29/49 | (2006.01) |
| G03F 1/72 | (2012.01) |
| H01L 21/033 | (2006.01) |

(52) U.S. Cl.
CPC ......... *H01L 29/66545* (2013.01); *G03F 1/72* (2013.01); *H01L 21/02164* (2013.01); *H01L 21/32139* (2013.01); *H01L 21/76224* (2013.01); *H01L 29/0653* (2013.01); *H01L 29/0847* (2013.01); *H01L 29/165* (2013.01); *H01L 29/4916* (2013.01); *H01L 29/66636* (2013.01); *H01L 29/7848* (2013.01); *H01L 21/0337* (2013.01)

(58) Field of Classification Search
CPC ............ H01L 29/6681; H01L 21/027; H01L 21/0274; H01L 21/0337; H01L 21/0338; H01L 21/3086; H01L 21/3088; H01L 21/32139; H01L 2224/27011; H01L 2224/27019
See application file for complete search history.

(56) References Cited

U.S. PATENT DOCUMENTS 6,603,162 B1 *  8/2003  Uchiyama ............. G03F 9/7076
257/296

* cited by examiner

*Primary Examiner* — Davienne Monbleau
*Assistant Examiner* — Leslie Pilar Cruz
(74) *Attorney, Agent, or Firm* — Ditthavong & Steiner, P.C.

(57) ABSTRACT

Enlarging the dummy electrode to the STI top width size by OPC cut mask correction and the resulting device are disclosed. Embodiments include forming an STI region in a silicon substrate, the STI region having a top width; and forming a dummy electrode on the STI region and a gate electrode on the silicon substrate, the dummy electrode having a width greater than or equal to the STI region top width.

10 Claims, 6 Drawing Sheets

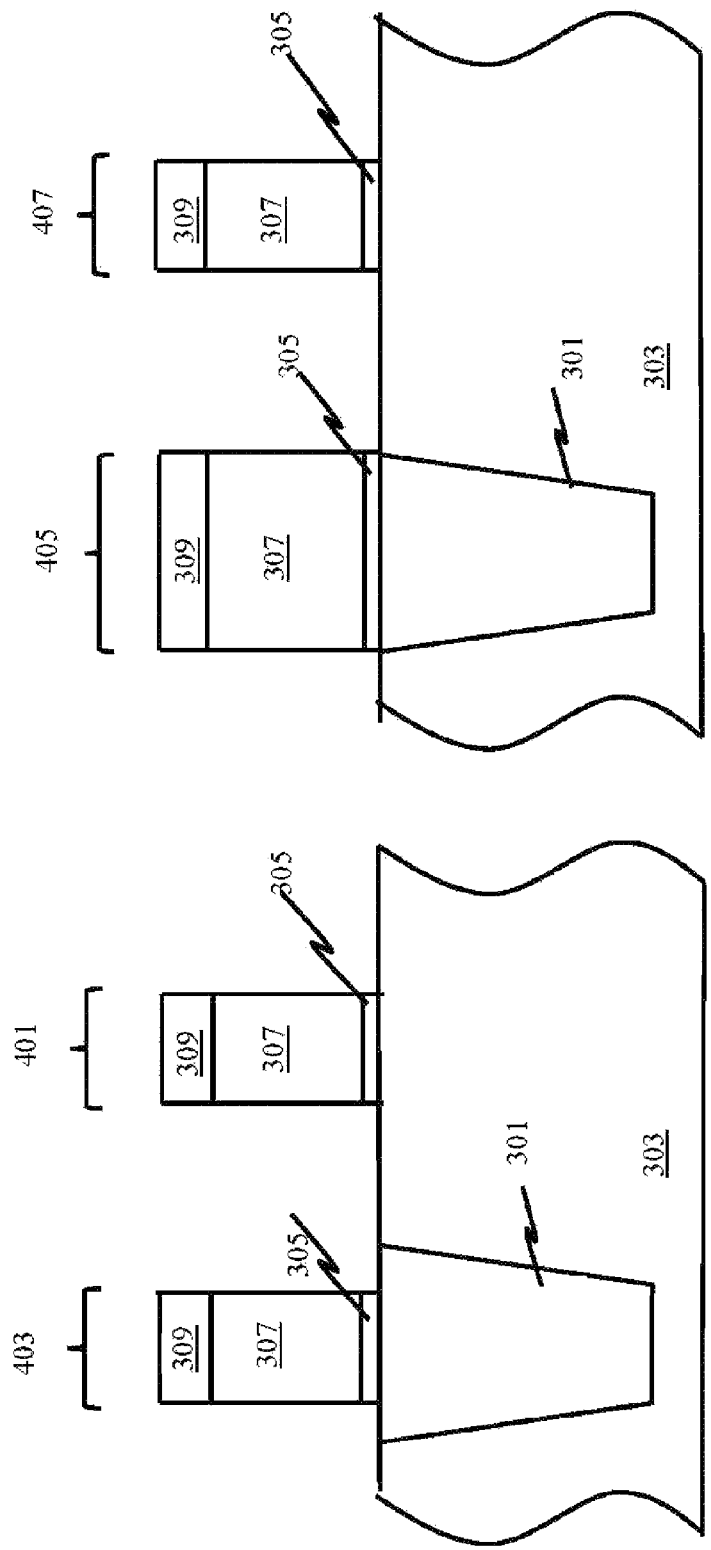

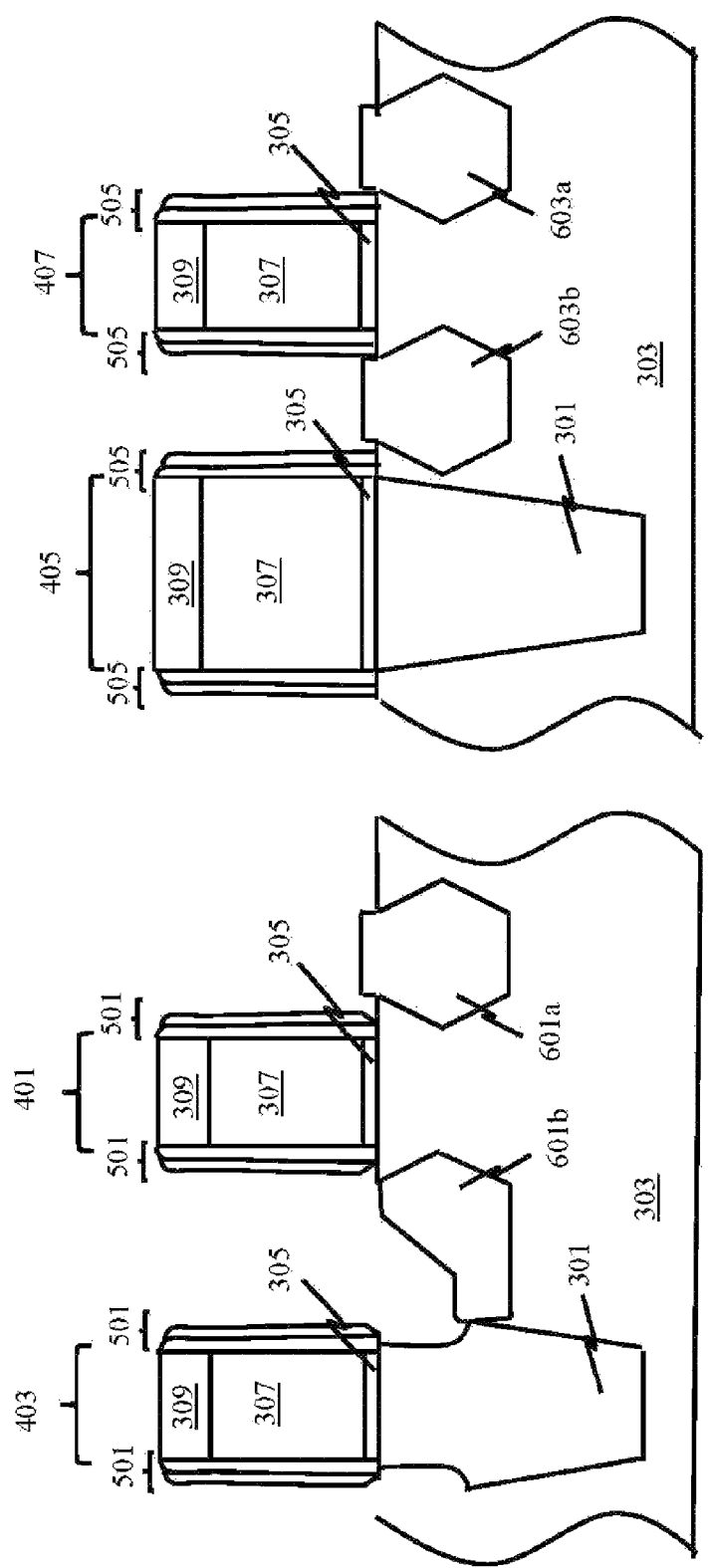

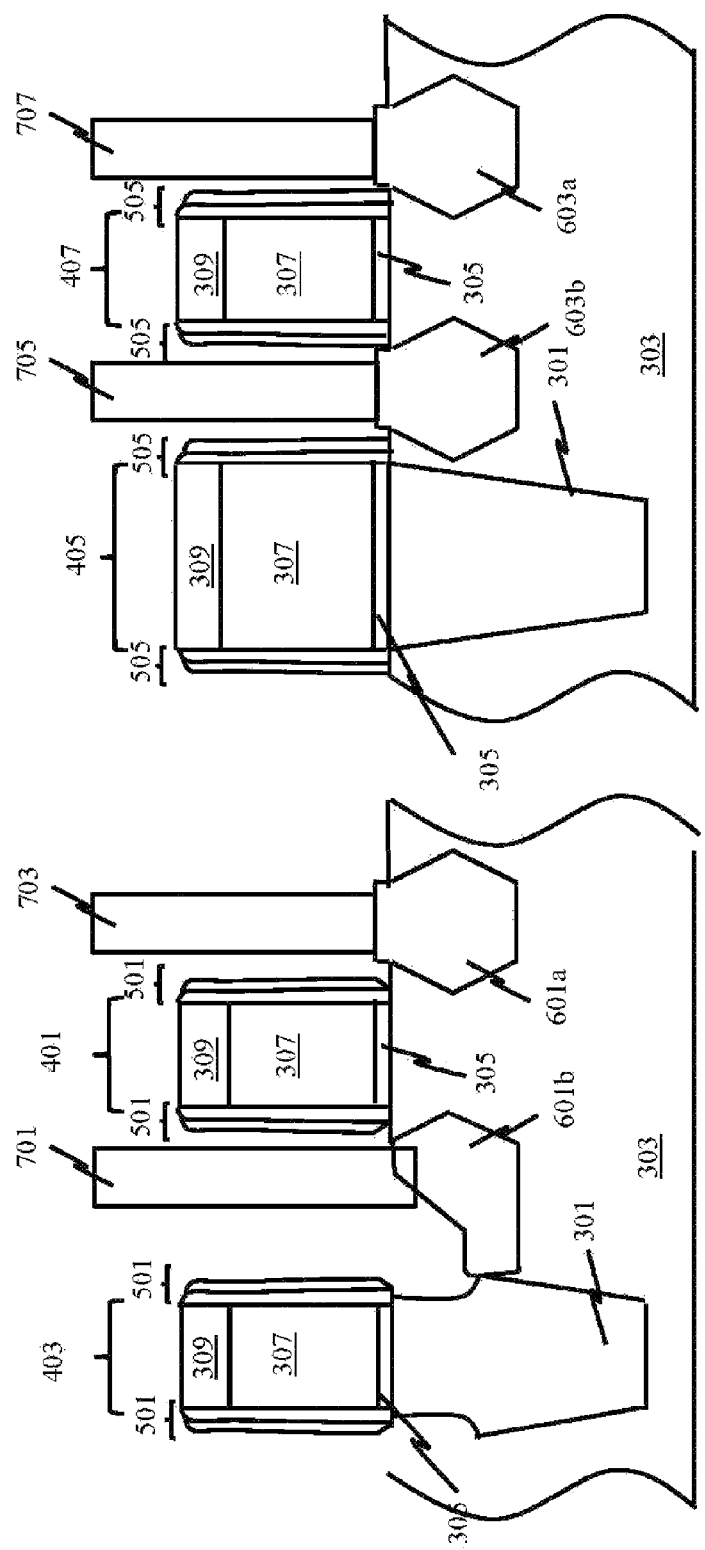

OPC ENLARGED DUMMY ELECTRODE TO ELIMINATE SKI SLOPE AT ESIGE

TECHNICAL FIELD

The present disclosure relates to fabrication of semiconductor devices employing embedded silicon germanium (eSiGe). The present disclosure is particularly applicable to devices with eSiGe adjacent shallow trench isolation (STI) regions.

BACKGROUND eSiGe has been widely used for source/drain regions of P-type metal oxide semiconductor (PMOS) devices to improve mobility. Source/drain regions of eSiGe are typically formed in a sigma shape, although other shapes are possible as well. For convenience, the sigma shape will be referenced throughout the disclosure, but it should be understood that other shapes are included as well. For example, as illustrated in FIG. 1, for a PMOS gate electrode 101 with gate dielectric 103, nitride cap 105, and spacers 107, eSiGe source/drain regions 109 surrounded by the silicon substrate 111 have a sigma shape, which allows for a solid contact area 113 between contact 115 and the source/drain region 109. As illustrated in FIG. 2, dummy electrodes are often formed, for example, between cells to maintain a constant pitch between gate electrodes. Dummy electrodes 201 are generally formed on STI regions 203, which are formed of silicon oxide. SiGe cannot grow on silicon oxide materials. Consequently, as illustrated in FIG. 2, eSiGe source/drain region 205 for electrode 101 adjacent the dummy electrode and therefore abutting the STI has a "ski slope" shape 207 rather than the sigma shape for other PMOS source/drain regions which only contact silicon. The ski slope introduces large amounts of variation including strain loss, STI loss, and small areas, leading to reduced performance for different devices such as length of diffusion (LOD) devices (in which only a single polysilicon line is formed over the silicon area).

A need therefore exists for methodology enabling formation of uniform source/drain regions with a sigma shape including adjacent an STI boundary, and the resulting device.

SUMMARY

An aspect of the present disclosure is a method of fabricating a semiconductor device with uniform sigma shaped eSiGe source/drain regions, even at STI boundaries, by expanding the size of dummy electrodes over the STI regions.

Another aspect of the present disclosure is a semiconductor device with uniform sigma shaped eSiGe source/drain regions, even at STI boundaries, including dummy electrodes over the STI regions which are at least as large as a top width of the STI regions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a shallow trench isolation (STI) region in a silicon substrate, the STI region having a top width; and forming a dummy electrode on the STI region and a gate electrode on the silicon substrate, the dummy electrode having a width greater than or equal to the STI region top width.

Aspects of the present disclosure include forming the dummy and gate electrodes by: depositing polysilicon over the STI region and the silicon substrate; performing optical proximity correction (OPC) to a gate electrode cut mask, expanding a width of the dummy electrode from a width of the gate electrode to a width greater than or equal to the STI top width; overlaying the OPC corrected gate electrode cut mask on the polysilicon; and etching the polysilicon through the OPC corrected gate electrode cut mask. Other aspects include forming eSiGe source/drain regions in the silicon substrate on opposite sides of the gate electrode. Further aspects include forming one of the eSiGe source/drain regions abutting the STI region. An additional aspect includes forming each of the eSiGe source/drain regions in a sigma shape. Another aspect includes forming first and second spacers on opposite sides of the gate electrode and of the dummy electrode, respectively, wherein the second spacers are formed on the silicon substrate. Other aspects include forming the eSiGe source/drain regions without a ski slope shape. A further aspect includes the STI region being formed of silicon dioxide. An additional aspect includes the gate electrode being a PMOS gate electrode.

Another aspect of the present disclosure is a device including: a silicon substrate; a shallow trench isolation (STI) region in the silicon substrate, the STI region having a top width; and a dummy electrode on the STI region and a gate electrode on the silicon substrate, the dummy electrode having a width greater than or equal to the STI region top width.

Aspects of the present disclosure include the dummy and gate electrodes being formed by using an optical proximity correction (OPC) corrected gate electrode cut mask. Other aspects include eSiGe source/drain regions in the silicon substrate on opposite sides of the gate electrode. A further aspect includes one of the eSiGe source/drain regions abutting the STI region. An additional aspect includes each of the eSiGe source/drain regions having a sigma shape. Another aspect includes first and second spacers on opposite sides of the gate electrode and of the dummy electrode, respectively, wherein the second spacers are formed on the silicon substrate. Further aspects include the eSiGe source/drain regions having no ski slope shape. Other aspects include the STI region being formed of silicon dioxide. An additional aspect includes the gate electrode being a PMOS gate electrode.

Another aspect of the present disclosure is a method including: forming at least one silicon dioxide shallow trench isolation (STI) region in a silicon substrate, each STI region having a top width; forming a dummy electrode on each STI region and at least one PMOS gate electrode on the silicon substrate, each dummy electrode having a width greater than or equal to the STI region top width; forming first and second spacers on opposite sides of each PMOS gate electrode and of each dummy electrode, respectively, wherein the second spacers are formed over the silicon substrate; and forming uniform sigma shaped eSiGe source/drain regions in the silicon substrate on opposite sides of each gate electrode, with at least one of the eSiGe source/drain regions abutting the STI region, wherein the dummy electrodes and gate electrodes are formed by: depositing polysilicon over the STI regions and the silicon substrate, performing optical proximity correction (OPC) to a gate electrode cut mask, expanding a width of each dummy electrode from a width of each gate electrode to a width greater than or equal to the STI top width, overlaying the OPC corrected gate electrode cut mask on the polysilicon, and etching the polysilicon. Aspects include forming contacts on the eSiGe source/drain regions.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 7A schematically illustrate a process flow for forming a conventional PMOS transistor adjacent a dummy electrode formed on an STI region, as illustrated in FIG. 2; and FIGS. 3B through 7B schematically illustrate a process flow for forming a PMOS transistor adjacent a dummy electrode formed on an STI region, in accordance with an exemplary embodiment.

DETAILED DESCRIPTION

Figure 2:
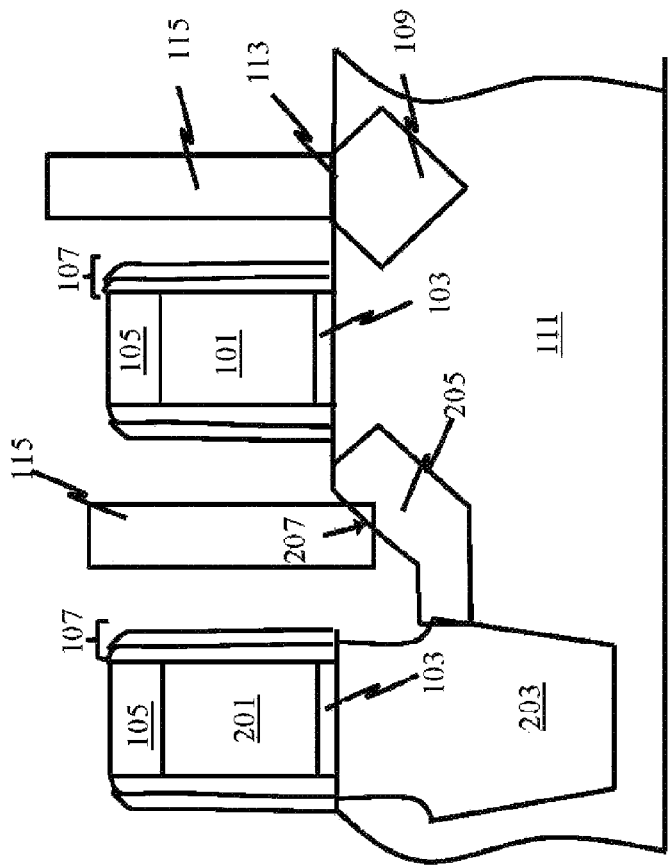
FIG. 2 schematically illustrates a conventional PMOS transistor adjacent a dummy electrode formed on an STI region.
Figure 1:
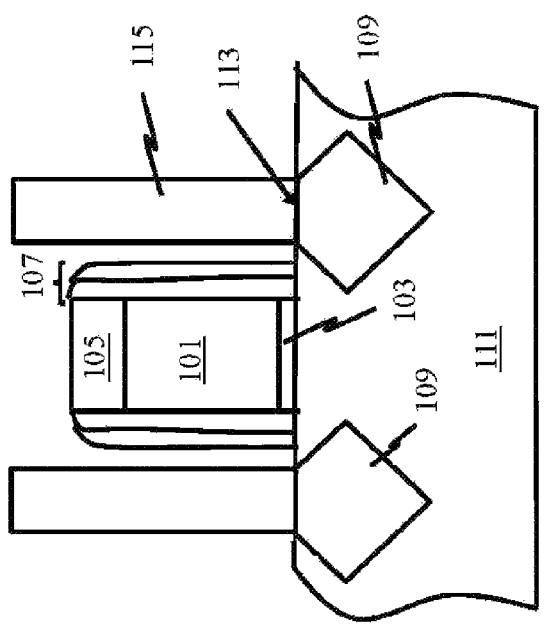
FIG. 1 schematically illustrates a conventional PMOS transistor.
Figure 3B:
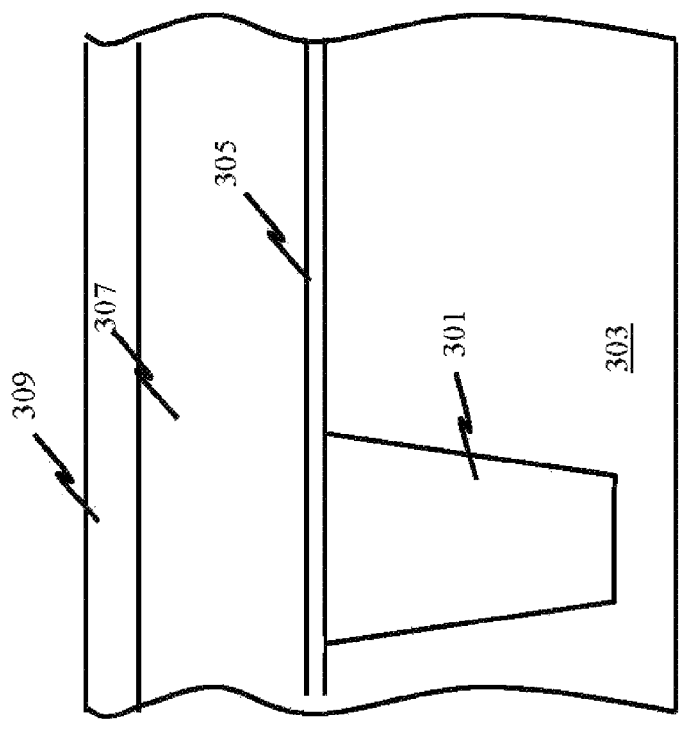
Figure 3A:
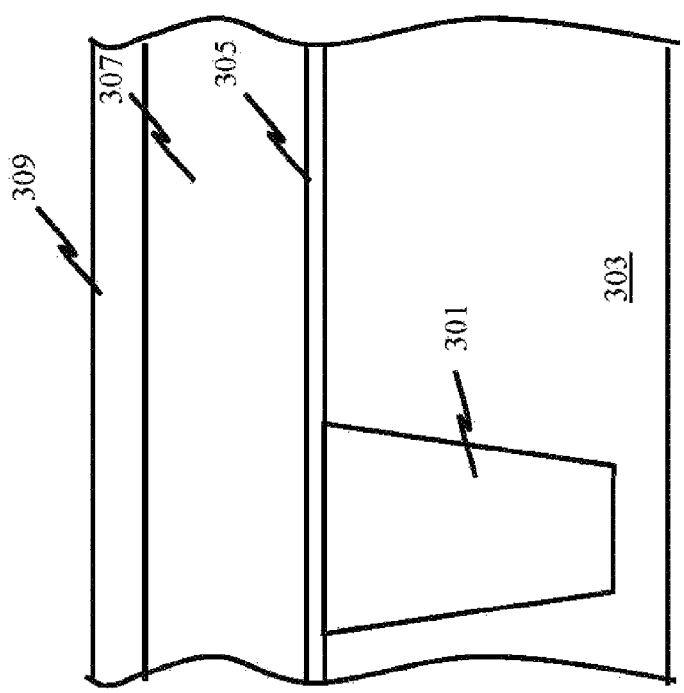

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of STI loss and ski slope shaped eSiGe PMOS source/drain regions adjacent the STI attendant upon forming dummy electrodes on the STI regions smaller than a top width of the STI region. In accordance with embodiments of the present disclosure, OPC is performed to expand the dummy electrode critical dimension to be at least as large as the top width of the STI region.

Methodology in accordance with embodiments of the present disclosure includes forming a shallow trench isolation (STI) region in a silicon substrate, the STI region having a top width; and forming a dummy electrode on the STI region and a gate electrode on the silicon substrate, the dummy electrode having a width greater than or equal to the STI region top width.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 3A through 7A illustrate a conventional process flow, and FIGS. 3B through 7B illustrate a process flow in accordance with an exemplary embodiment. Adverting to FIGS. 3A and 3B, the exemplary embodiment begins the same way as the conventional process flow with an STI region 301 being formed in a substrate 303, which may be formed of bulk silicon or may be a silicon-on-insulator (SOI) substrate. The STI region may for example have a top width of 60 nanometers (nm) to 150 nm. A well implant (not shown for illustrative convenience) is performed, and a gate oxide layer 305, a polysilicon layer 307, and cap layer 309 are sequentially deposited over substrate 303. Alternatively, a silicon oxynitride (SiON) layer may be used with polysilicon layer 307 as a gate dielectric rather than gate oxide layer 305. As a further alternative to the gate oxide layer 305 and polysilicon layer 307, a high-k dielectric and metal gate (HKMG) may be employed.

As illustrated in FIG. 4A, a mask overlay (not shown for illustrative convenience) is formed over the cap layer 309 and used to etch gate oxide layer 305, polysilicon layer 307, and cap layer 309 to form a PMOS gate electrode stack 401 and a dummy electrode stack 403. Dummy electrode stack 403 is formed to the same size as PMOS gate electrode stack 401, which may for example have a width of 14 nm to 50 nm.

Figures 5A, 5B:
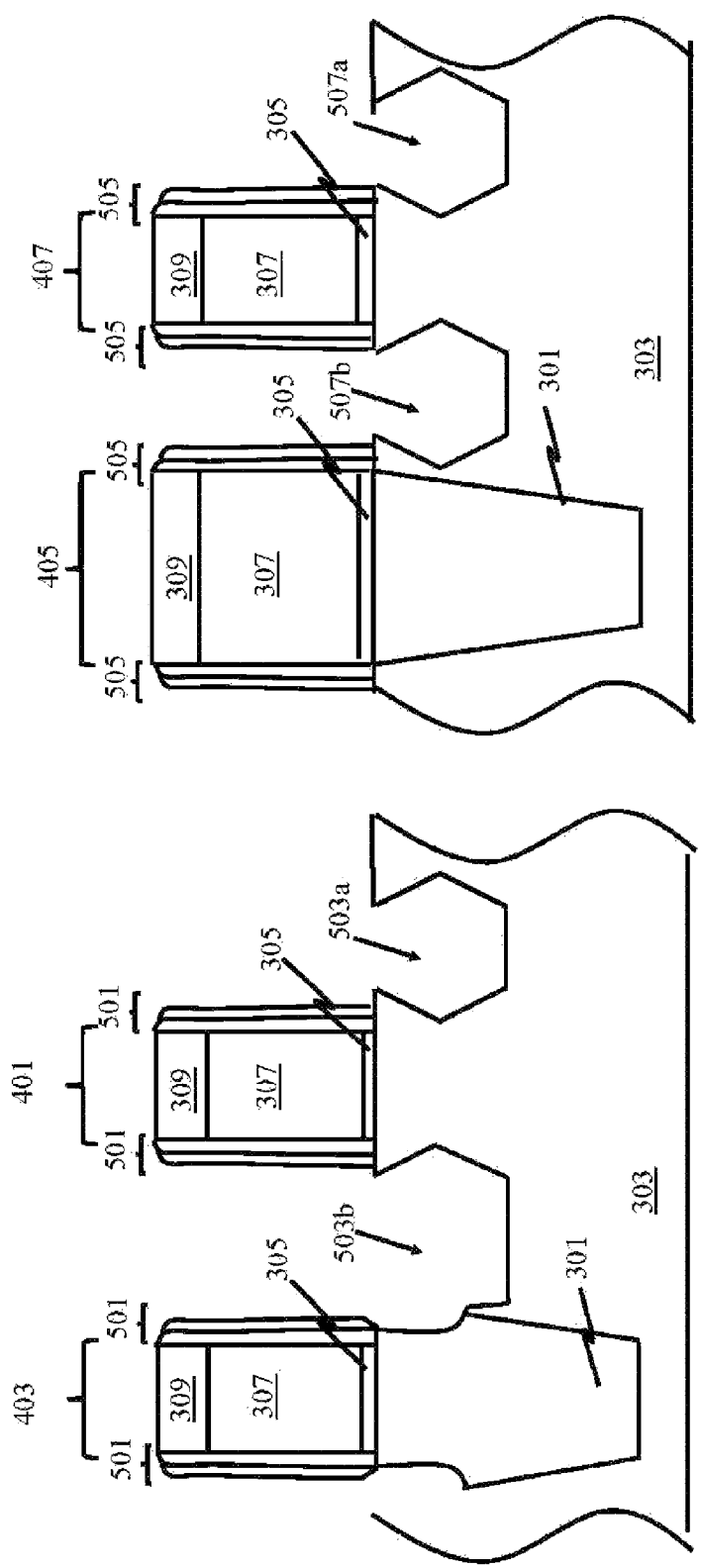

Adverting to FIG. 5A, spacers 501 are formed on opposite sides of PMOS gate electrode stack 401 and on opposite sides of dummy electrode stack 403. Spacers 501 include a spacer 0 adjacent each side of the gate electrode stack and each side of the dummy electrode stack and a spacer 1 adjacent each spacer 0. Between forming spacer 0 and spacer 1, source/drain halo/extension implantations (not shown for illustrative convenience) may be performed. Next, cavities 503a and 503b for source/drain regions for the PMOS gate electrode stack are wet etched into substrate 303, for example using tetramethylammonium hydroxide (TMAH). Cavities 503a and 503b are shown as sigma shaped. The sigma shaped cavity allows very close proximities and therefore maximum stress inside the transistor channel region. However, as previously mentioned, other shapes are possible. As illustrated, since the spacers 501 do not cover and, therefore, protect STI region 301, formation of cavity 503b etches away a portion of STI region 301.

As illustrated in FIG. 6A, eSiGe 601a and 601b is grown in cavities 503a and 503b, respectively. However, since no silicon remains to one side of cavity 503b, the eSiGe does not grow evenly, like 601a, but rather forms a ski slope shape. The eSiGe may be doped either in situ during the epitaxial (epi) growth or subsequent to the epi growth.

Returning to FIG. 4B, in accordance with an exemplary embodiment, the mask overlay used to etch the gate and dummy electrodes in FIG. 4A is adjusted by optical proximity correction (OPC) to form dummy electrode stack 405 the same size as or larger than the top width of STI 301 while keeping the size of PMOS gate electrode stack 407 the same (as in FIG. 4A). In other words, the width of dummy electrode stack 405 may be increased by 10 nm to 50 nm by OPC.

As illustrated in FIG. 5B, spacers 505 are formed on opposite sides of PMOS gate electrode stack 407 and on opposite sides of dummy electrode stack 405. Spacers 505 include a spacer 0 adjacent each side of the gate electrode stack and each side of the dummy electrode stack and a spacer 1 adjacent each spacer 0, similar to FIG. 5A. Between forming spacer 0 and spacer 1, source/drain halo/extension implantations (not shown for illustrative convenience) may be performed. Next, sigma shaped cavities 507a and 507b for source/drain regions for the PMOS gate electrode stack are wet etched into substrate 303 using TMAH, similar to FIG. 5A. Again, although other shapes are possible, sigma shaped cavities are described throughout the disclosure, as a sigma shape allows very close proximities and therefore maximum stress inside the transistor channel region. As illustrated, in accordance with the exemplary embodiment, spacers 505 do cover and, therefore, protect STI region 301, so all of STI region 301 remains intact, and a portion of silicon substrate 303 remains on both sides of cavity 507b.

Adverting to FIG. 6B, eSiGe 603a and 603b is grown in cavities 507a and 507b, respectively. Due to the silicon remaining under spacers 505 at the STI boundary, eSiGe 603b is able to form in a sigma shape the same as 603a, with no ski slope near the STI boundary. Accordingly, variation and device performance drop due to the ski slope may be fully recovered. The eSiGe may be doped either in situ during the epitaxial (epi) growth or subsequent to the epi growth.

In addition, as illustrated in FIGS. 7A and 7B, source/drain implantation is followed by the formation of source/drain contacts 701 and 703 in FIG. 7A and 705 and 707 in FIG. 7B. Whereas contact 701 formed over eSiGe 601b has a small contact area, contact 705 over eSiGe 603b has an improved contact area.

The embodiments of the present disclosure can achieve several technical effects, such as elimination of the ski slope shape for eSiGe near the STI boundary, which in turn decreases strain loss and STI loss, increase source/drain contact area, and overall reduces variation and performance drop. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a shallow trench isolation (STI) region in a silicon substrate, the STI region having a top width; and
   forming a dummy electrode on the STI region and a gate electrode on the silicon substrate, the dummy electrode having a width greater than or equal to the STI region top width,
   wherein the dummy and gate electrodes are formed by:
   depositing polysilicon over the STI region and the silicon substrate;
   performing optical proximity correction (OPC) to a gate electrode cut mask, expanding a width of the dummy electrode from a width of the gate electrode to a width greater than or equal to the STI top width;
   overlaying the OPC corrected gate electrode cut mask on the polysilicon; and
   etching the polysilicon through the OPC corrected gate electrode cut mask.

2. The method according to claim 1, further comprising forming eSiGe source/drain regions in the silicon substrate on opposite sides of the gate electrode.

3. The method according to claim 2, comprising forming one of the eSiGe source/drain regions abutting the STI region.

4. The method according to claim 3, comprising forming each of the eSiGe source/drain regions in a sigma shape.

5. The method according to claim 3, further comprising forming first and second spacers on opposite sides of the gate electrode and of the dummy electrode, respectively, wherein the second spacers are formed on the silicon substrate.

6. The method according to claim 3, comprising forming the eSiGe source/drain regions without a ski slope shape.

7. The method according to claim 3, wherein the STI region is formed of silicon dioxide.

8. The method according to claim 1, wherein the gate electrode is a PMOS gate electrode.

9. A method comprising:
   forming at least one silicon dioxide shallow trench isolation (STI) region in a silicon substrate, each STI region having a top width;
   forming a dummy electrode on each STI region and at least one PMOS gate electrode on the silicon substrate, each dummy electrode having a width greater than or equal to the STI region top width;
   forming first and second spacers on opposite sides of each PMOS gate electrode and of each dummy electrode, respectively, wherein the second spacers are formed over the silicon substrate; and
   forming uniform sigma shaped eSiGe source/drain regions in the silicon substrate on opposite sides of each gate electrode, with at least one of the eSiGe source/drain regions abutting the STI region,
   wherein the dummy electrodes and gate electrodes are formed by:
   depositing polysilicon over the STI regions and the silicon substrate,
   performing optical proximity correction (OPC) to a gate electrode cut mask, expanding a width of each dummy electrode from a width of each gate electrode to a width greater than or equal to the STI top width,
   overlaying the OPC corrected gate electrode cut mask on the polysilicon, and
   etching the polysilicon.

10. The method according to claim 9, further comprising forming contacts on the eSiGe source/drain regions.

* * * * *